United States Patent [19]

Tults

[11] Patent Number: 4,485,404
[45] Date of Patent: Nov. 27, 1984

[54] DIGITAL AFT SYSTEM WHICH IS ACTIVATED DURING VERTICAL RETRACE INTERVALS

[75] Inventor: Juri Tults, Indianapolis, Ind.
[73] Assignee: RCA Corporation, New York, N.Y.
[21] Appl. No.: 413,769
[22] Filed: Sep. 1, 1982
[51] Int. Cl.³ .................................... H04N 5/50
[52] U.S. Cl. ............................... 358/195.1
[58] Field of Search ............... 358/195.1, 191.1, 193.1; 455/182, 164, 174

[56] References Cited

U.S. PATENT DOCUMENTS

| | | | |
|---|---|---|---|
| 3,821,650 | 6/1974 | Kase et al. | 325/423 |
| 3,940,554 | 2/1976 | Masuda | 358/195.1 |
| 4,077,008 | 2/1978 | Rast et al. | 455/182 |
| 4,078,212 | 3/1978 | Rast | 325/421 |
| 4,236,182 | 11/1980 | Minoura et al. | 358/191.1 |
| 4,305,157 | 12/1981 | Mogi | 455/183 |
| 4,358,791 | 11/1982 | French | 358/195.1 |
| 4,388,650 | 6/1983 | Schmidtmann | 358/197 |
| 4,442,547 | 4/1984 | Tults | 358/191.1 |

OTHER PUBLICATIONS

Abstract of a talk entitled "Modern Techniques of FLL Tuning", by D. Vazirani and F. Sutaria, IEEE International Conference on Consumer Electronics, Jun. 10, 1982, pp. 124–125.
U.S. Ser. No. 242,619, now U.S. Pat. No. 4,352,206, by F. Aschwanden entitled Frequency Comparison Arrangement for a Digital Tuning System (now allowed).
P. 96 of the book entitled "Color Television: Theory and Serving", Clyde N. Herrick, Reston Pub. Company, Reston, Virginia, 1977.
P. 246 of the book entitled "Microelectronic Circuits", Adel S. Sedra & Kenneth C. Smith, CBC College Pub. Co., NY, 1982.

Primary Examiner—John C. Martin
Assistant Examiner—Michael D. Parker
Attorney, Agent, or Firm—Eugene M. Whitacre; Paul J. Rasmussen; Peter M. Emanuel

[57] ABSTRACT

A digital fine tuning system for a television receiver includes a counter arrangement for measuring the frequency of the IF picture carrier by counting cycles of the IF picture carrier during a measurement interval and comparing the count at the end of the measurement interval to a predetermined count related to the nominal frequency of the IF picture carrier. To prevent counting, and thereby frequency measurement errors, due to the overmodulation of the picture carrier during image intervals, the frequency measurement operation is enabled during a predetermined portion of the vertical retrace interval when the picture carrier is not overmodulated.

11 Claims, 10 Drawing Figures

DIGITAL AFT SYSTEM WHICH IS ACTIVATED DURING VERTICAL RETRACE INTERVALS

The present invention pertains to the field of digital automatic fine tuning (AFT) apparatus in which a counter is employed to measure frequency of an information bearing carrier of an IF signal to develop a tuning control signal which is coupled to a local oscillator in order to correct frequency deviations of the information bearing carrier.

Digital AFT apparatus of the type described above is desirable since it makes possible the elimination of costly discrete circuitry, including tuned circuits which must be accurately aligned, associated with analog AFT aparatus conventionally employed in television and radio receivers. Digital AFT apparatus is also desirable since it allows for the incorporation of a significant portion of the tuning control apparatus of a receiver in digital signal processing integrated circuits for other portions of the receiver.

One problem encountered in such digital AFT apparatus is that if the information bearing carrier of the received RF signal is overmodulated, the corresponding information bearing carrier of the IF signal will also be overmodulated and may have an amplitude so low that a counter employed to measure its frequency cannot reliably respond to it. This may cause disturbing interruptions in the tuning process which, e.g., in a television receiver, may result in corresponding disturbances in the image and audio responses.

In accordance with principles of the present invention, digital AFT apparatus for a television receiver is provided which is enabled to measure the frequency of an information bearing carrier of the IF signal during retrace intervals, such as during a portion of the vertical retrace interval, in which the picture carrier tends not to be over-modulated and therefore has an amplitude suitable for reliable frequency measurement.

The present invention will be described in detail with reference to the accompanying Drawing in which.

Figure 1:
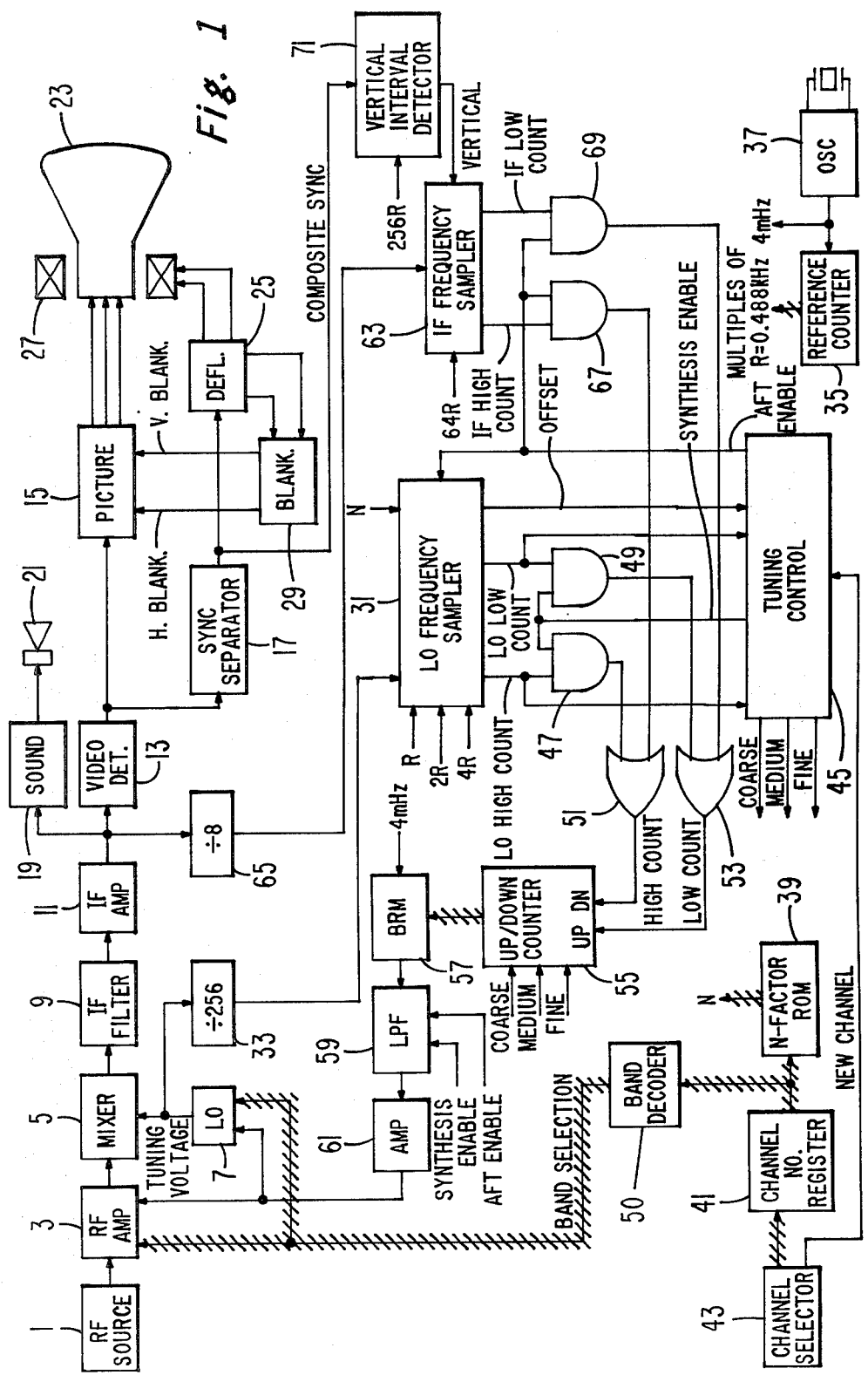
FIG. 1 is a block diagram of a television receiver including a preferred embodiment of the present invention.
Figure 3:
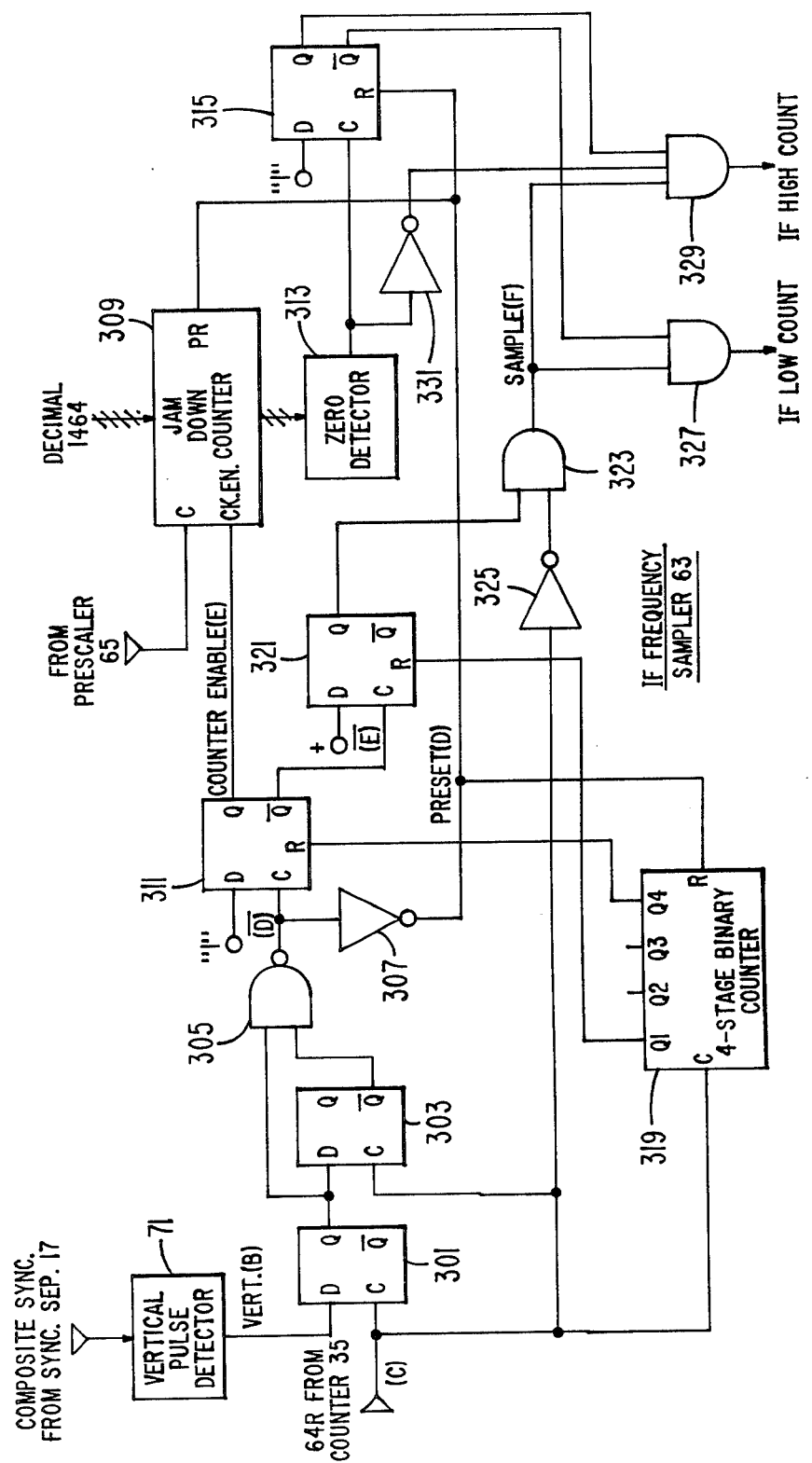
Figure 4:
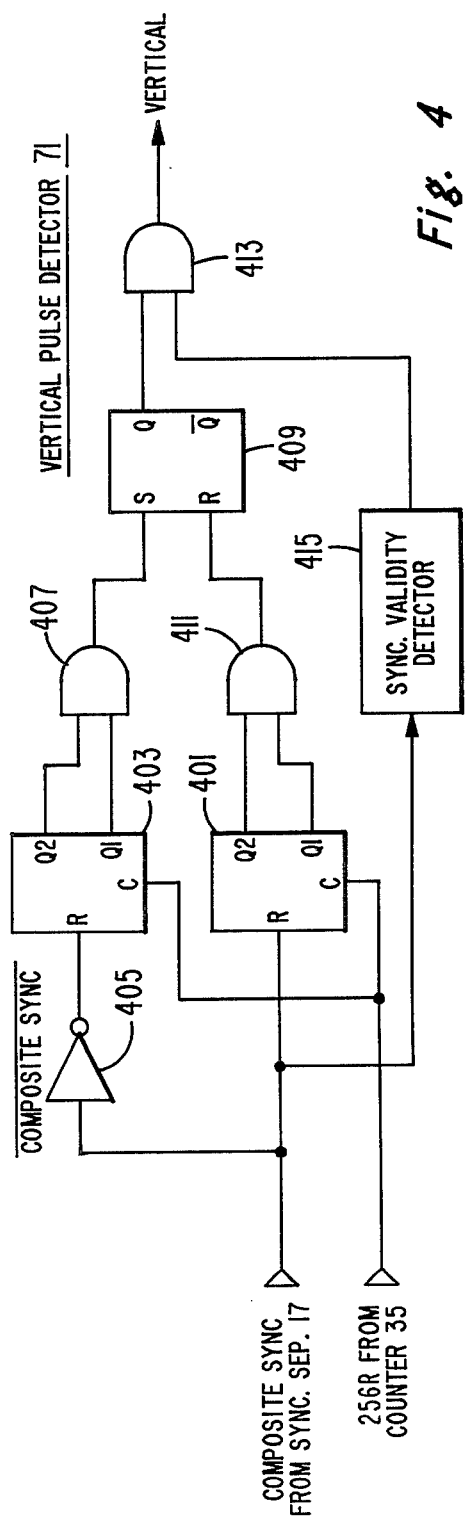
Figure 5:
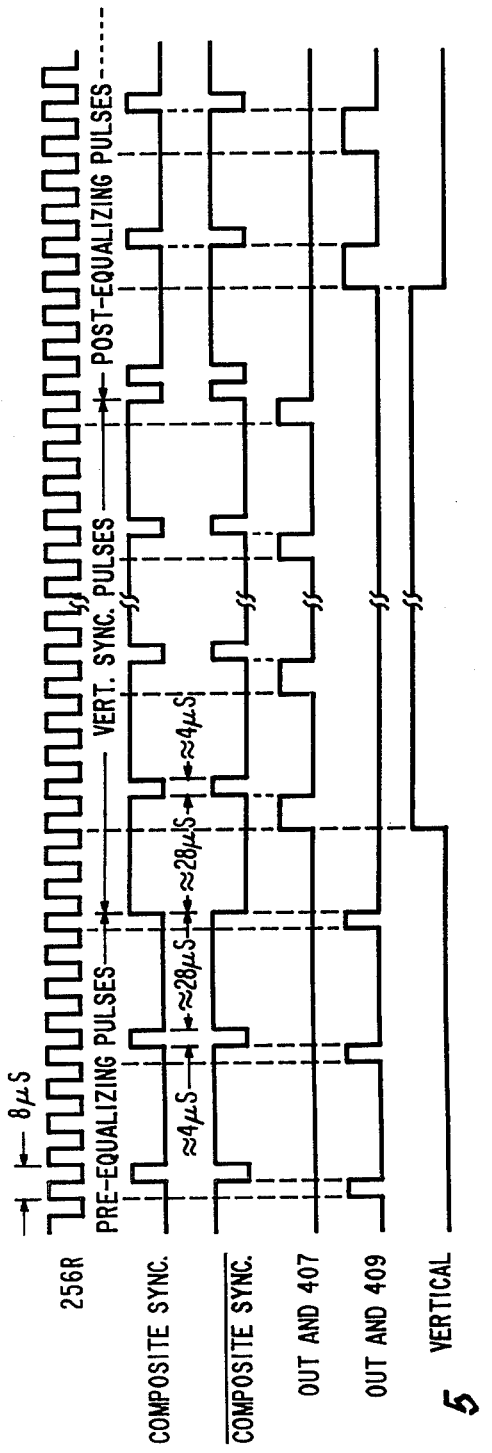
Figure 6:
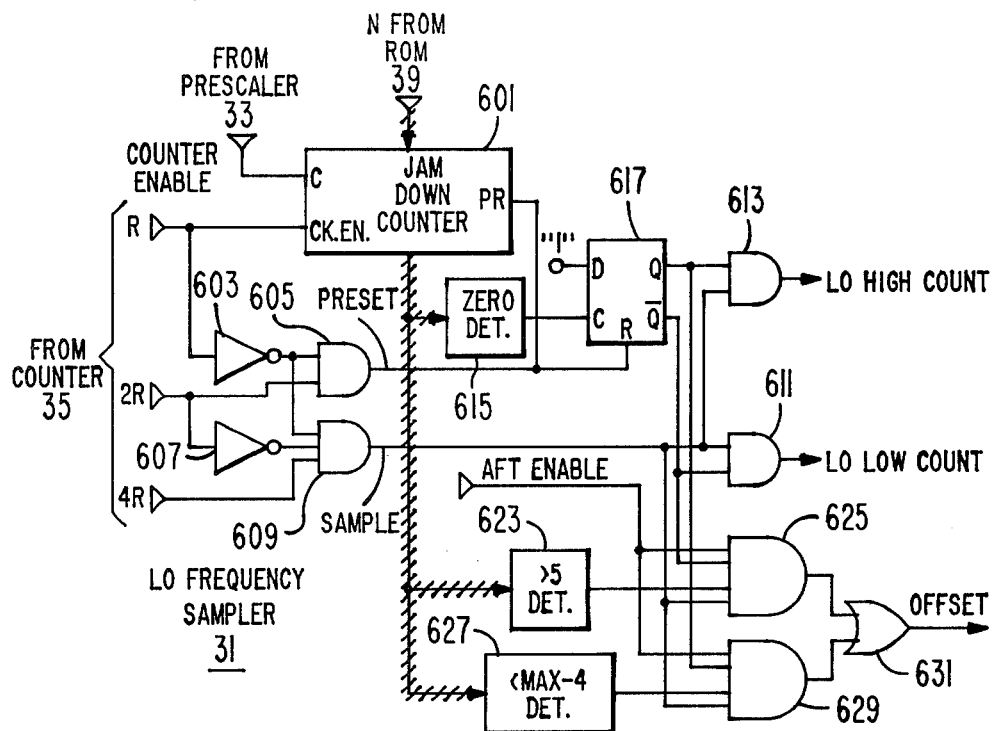
Figure 7:
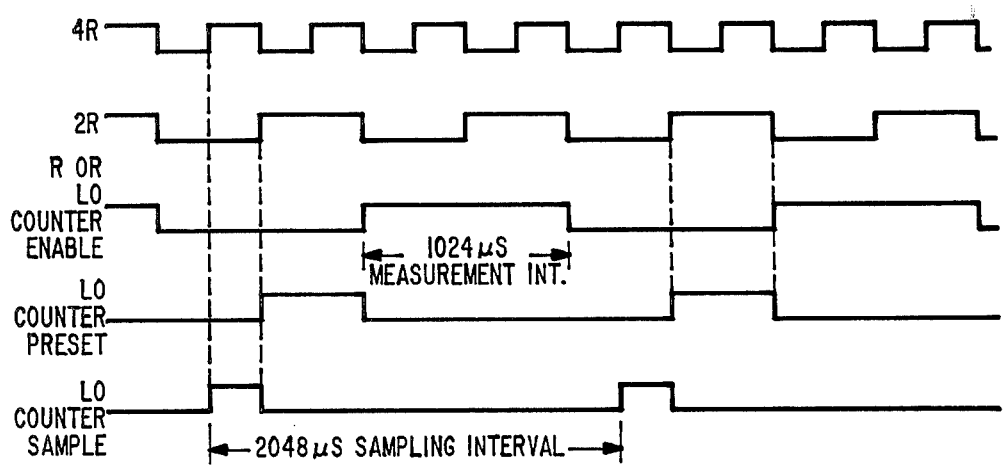
Figure 8:
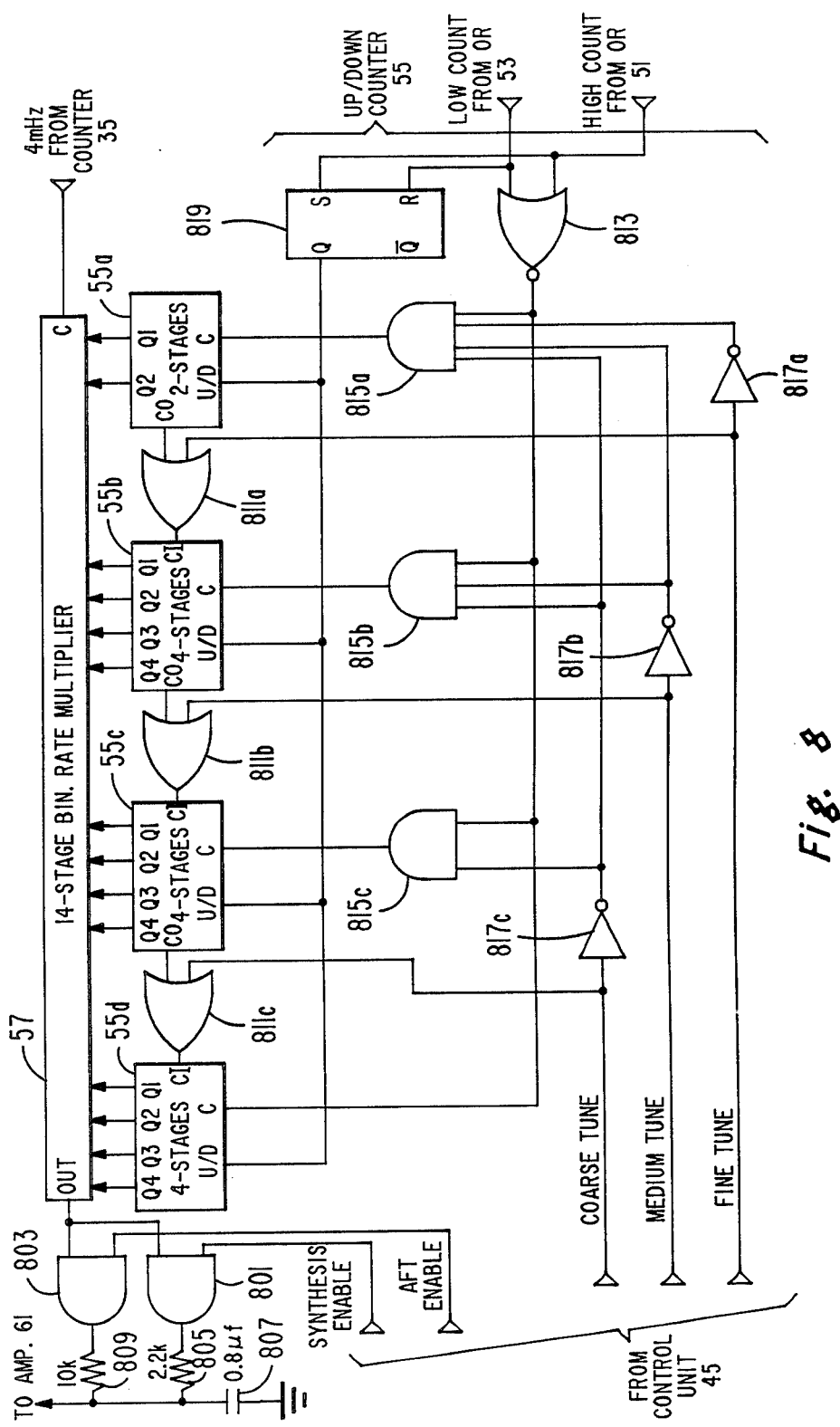
Figure 9:
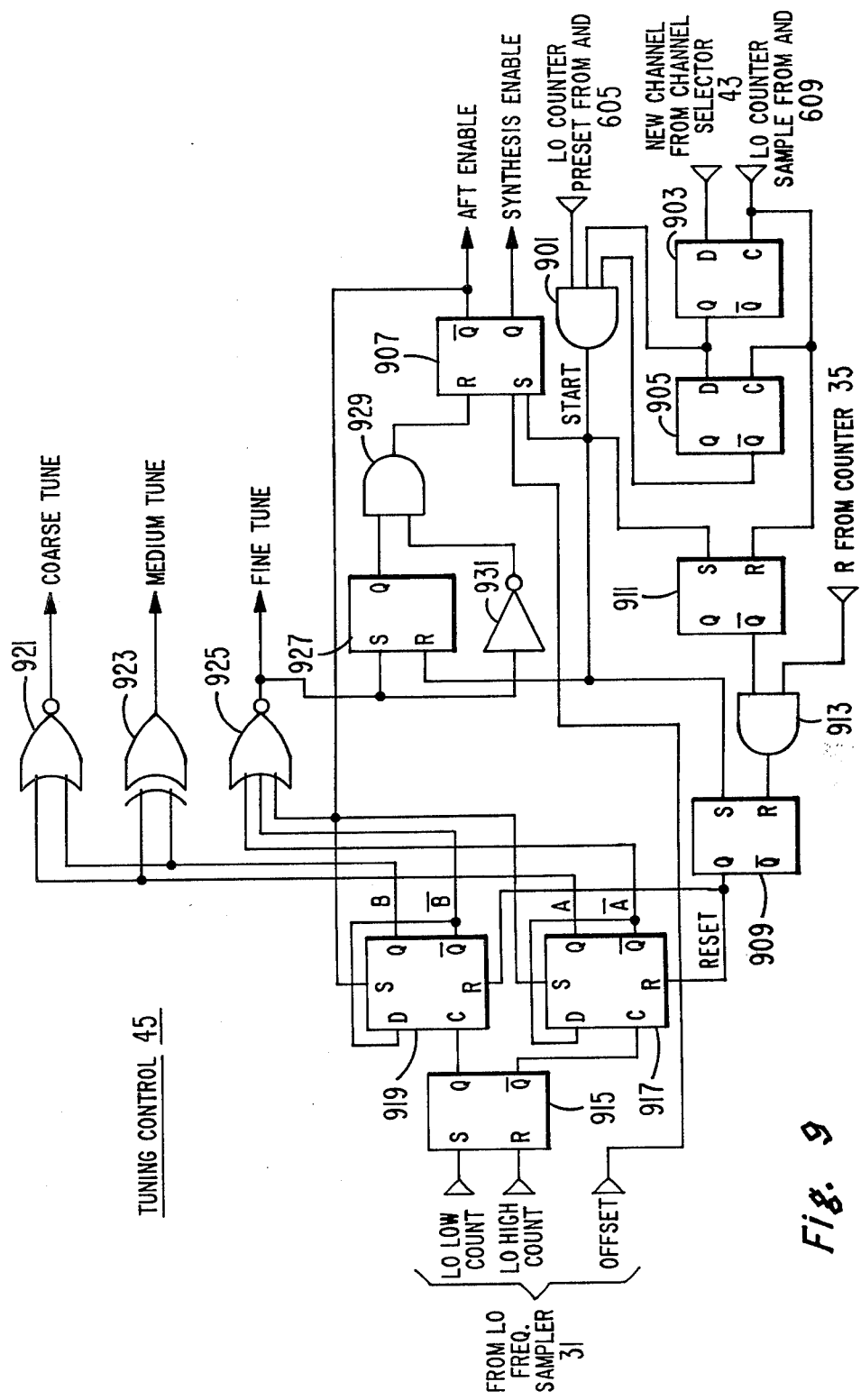
Figure 10:
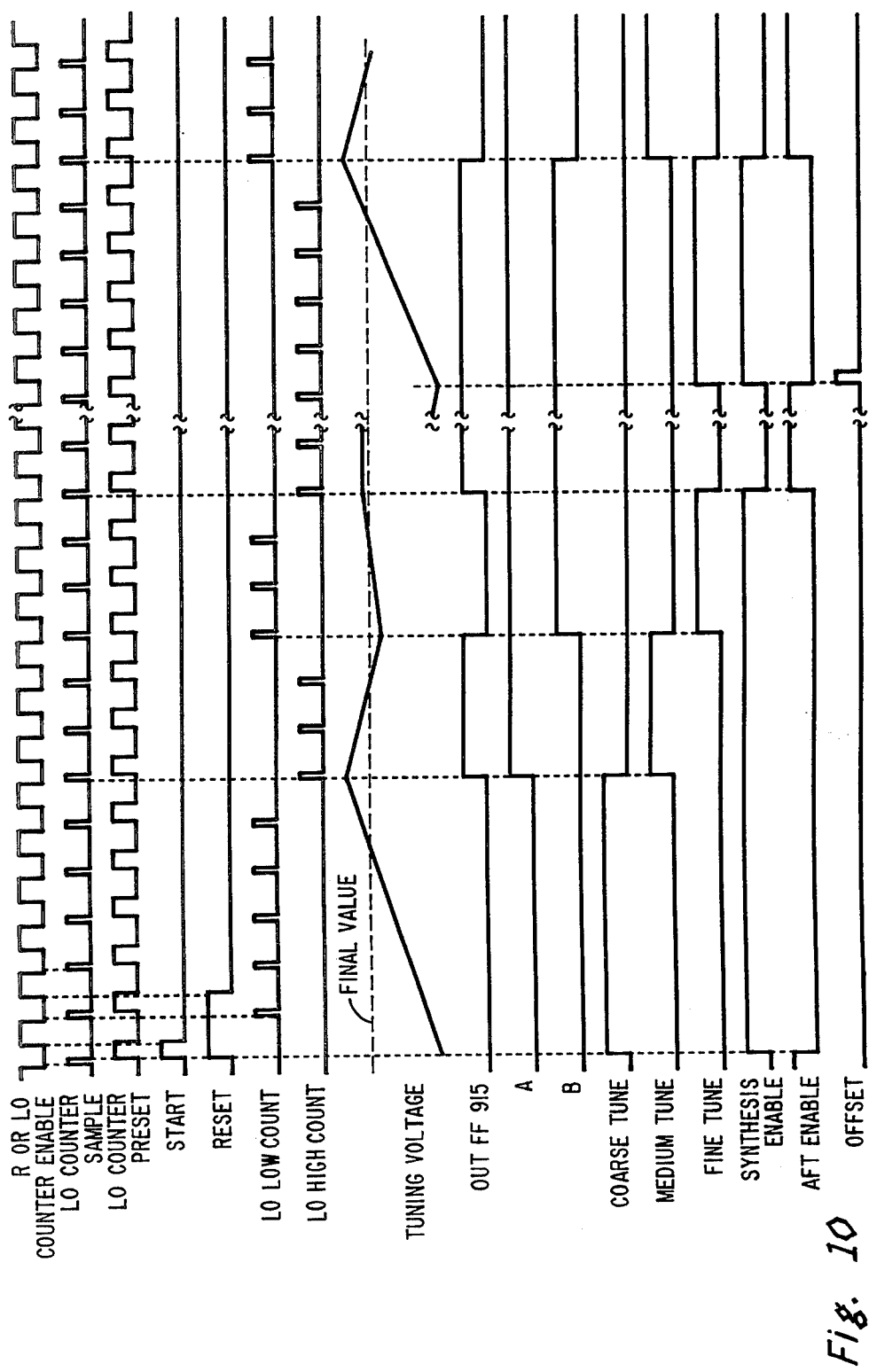

FIGS. 3, 4 and 6, 8 and 9 are logic diagrams of implementations of various portions of the preferred embodiment shown in block form in FIG. 1; and FIGS. 5, 7 and 10 show graphical representations of various timing signals useful in understanding the implementations shown in FIGS. 4, 6 and 9, respectively.

In the FIGURES lines between blocks with crossmarks indicate multiple signal paths.

Now referring to FIG. 1, a source of RF signals 1 provides a plurality of RF television signals to a television receiver corresponding to respective channels. Each RF signal includes modulated picture, color and sound carriers. The RF signals supplied by RF source 1 are coupled to an RF amplifier 3 which is tuned in response to a tuning voltage (TV) to select one of the RF signals corresponding to a channel selected by a user. The selected RF signal is coupled to a mixer 5. Mixer 5 also receives a local oscillator signal generated by a local oscillator 7. Local oscillator 7 is also responsive to the tuning voltage to control the frequency of the local oscillator signal in accordance with the selected channel. Mixer 5 heterodynes the RF signal selected by RF amplifier 3 with the local oscillator signal generated by local oscillator 7 to produce an IF signal including modulated picture, color and sound carriers corresponding to those of the selected RF signal. In the United States the picture carrier has a nominal frequency of 45.75 mHz. The color carrier has a nominal frequency of 42.17 mHz. The sound carrier has a nominal frequency of 41.25 mHz.

RF amplifier 3 and local oscillator 7 each include tuned circuits for determining their frequency responses. Each tuned circuit includes an inductor and a voltage controlled capacitance diode, commonly referred to as a "varactor" diode. The varactor diode is reverse biased by the tuning voltage to exhibit a capacitive reactance. The magnitude of the tuning voltage determines the magnitude of the capacitive reactance and therefore the frequency response of the tuned circuit. Since a single varactor controlled tuned circuit configuration is not capable of being tuned throughout the entire television range, different tuned circuit configurations are selectively enabled in response to band selection control signals generated in accordance with the frequency band of the selected channels.

The IF signal generated by mixer 5 is coupled to an IF filter 9 which filters the received IF signal. The filtered IF signal is amplified by an IF amplifier 11 and coupled to a video detector 13. Video detector 13 demodulates the filtered and amplified IF signal to produce a baseband video signal representing luminance, chrominance and synchronizing information. The baseband video signal is coupled to a picture processing unit 15 and to a synchronization signal (sync) separator 17. The IF signal is also coupled to a sound processing unit 19 which extracts the sound information from the IF signal to produce an audio signal. The audio signal is amplified by sound processing unit 19 and coupled to a speaker 21.

Picture processing unit 15 separates the baseband video signal into signals representing luminance and chrominance information and processes the separated luminance and chrominance signals to produce signals, R, G and B, representing red, green and blue information, respectively. The R, B and G signals are coupled to respective electron guns of a picture tube 23 which in response to these signals generates respective electron beams.

Sync separator 17 extracts a composite picture synchronizing signal (graphically illustrated in FIG. 5) containing horizontal and vertical synchronizing pulses from the baseband video signal. The composite synchronizing signal is coupled to a deflection unit 25 which produces horizontal and vertical deflection signals. The deflection signals are coupled to deflection coils 27 associated with picture tube 23 for deflecting the electron beams produced by the electron guns of picture tube 23 in a conventional raster pattern. Specifically, horizontal and vertical deflection signals cause the electron beam generated by the guns of picture tube 23 to be horizontally scanned in successive scan lines. After each scan line the electron beams are retraced to the beginning of the next lower scan line. At the end of a complete field of scan lines (525 in the United States) the electron beams are retraced to the top of the next field during a vertical retrace interval.

A blanking unit 29 is responsive to the horizontal and vertical deflection signals generated within deflection unit 25 to generate horizontal and vertical blanking pulses during the horizontal and vertical retrace intervals, respectively. The blanking pulses are coupled to picture processing unit 15 to inhibit the generation of an image during the retrace intervals.

The portion of the television receiver shown in FIG. 1 described so far is conventional and therefore need not be described in greater detail. The remaining portion of the television receiver shown in FIG. 1 comprises a tuning control system for generating the tuning voltage and band switching signals for RF amplifier 3 and local oscillator 7 and includes a preferred embodiment of the present invention.

Basically, the tuning control system includes two frequency locked loops (FLLs). When a new channel is selected, the operation of a first FLL is enabled. The first FLL measures the frequency of the local oscillator (LO) signal and generates control signals for controlling the magnitude of the tuning voltage until the frequency of the LO signal is within a predetermined range of the nominal value for the selected channel. When the first FLL has completed its operation, the operation of the second FLL is enabled. The second FLL measures the frequency of the picture carrier of the IF signal and generates control signals for controlling the magnitude of the tuning voltage until the frequency of the picture carrier is within a predetermined range of its nominal value.

The first FLL synthesizes the nominal LO frequency for the selected channel. The nominal LO frequency is that frequency required to tune the broadcast RF signal associated with the respective channel. In the United States, broadcast RF signals are required by the Federal Communication Commission to have very precise standard frequencies. The second FLL makes it possible to automatically fine tune the receiver to RF signals which are offset in frequency with respect to respective broadcast RF signals. Such nonstandard frequency RF carriers may be provided by cable or master antenna television systems, video tape and disk players, video games or home computers which may comprise RF source 1.

In accordance with an aspect of the present invention, to avoid inaccuracies in the frequency measurement of the picture carrier of the IF signal due to the overmodulation of the picture carrier, as discussed above, the measurement of the picture carrier of the IF signal is made during a portion of the vertical retrace interval when the picture carrier tends not to be overmodulated.

The first FLL includes a local oscillator (LO) frequency sampler 31 for measuring the frequency of the local oscillator signal. For this purpose, the LO signal is coupled to a frequency divider or prescaler 33 which divides the frequency of the LO signal by a predetermined division factor, e.g., 256, to produce a frequency divided version of the LO signal which is coupled to LO frequency sampler 31. The frequency divided version of the LO signal has one pulse for every 256 periods of the LO signal. As will be described in greater detail with reference to FIG. 6, LO frequency sampler 31 includes a counter which is enabled to count the pulses of the frequency divided version of the LO signal during a measurement interval. The division factor of prescaler 33 is selected so that the frequency divided version of the local oscillator signal has a frequency within the frequency range in which the counter of LO frequency sampler 31 is capable of operating. LO frequency sampler 31 receives timing signals by which the measurement interval is established from a counter 35. Counter 35 produces these timing signals and timing signals for other portions of the tuning control system by dividing the frequency of the output signals of a crystal oscillator 37 which oscillates at a predetermined reference frequency, e.g., 4 mHz, by factors of two.

The lowest frequency timing signal has a frequency of 488.2 Hz (4 mHz ÷ $2^{13}$ or 8192) or a period of 2042 microseconds and is referred to as R. Other timing signals shown in FIG. 1 and other FIGURES are indicated as 2R, 4R, 64R and 256R where the coefficient of R indicates the inverse relationship of the period of the partial timing signal to that of R so that 2R has a period of 1024 microseconds, 4R has a period of 512 microseconds, 64R has a period of 32 microseconds and 256R has a period of 8 microseconds.

LO frequency sampler 31 also receives binary signals representing a predetermined number N corresponding to the selected channel from a read only memory (ROM) 39 in response to binary signals representing the channel number of the selected channel stored in a channel number register 41. The binary signals representing the selected channel are loaded into channel number register 41 from a channel number selector 43. Channel selector 43 may include a calculator-like keyboard by which a user may sequentially enter the two digits of the selected channel number. When a new channel number is entered, channel selector 43 generates a high logic level "new channel" signal which is coupled to a tuning control unit 45. In response to the "new channel signal", tuning control unit 45 generates a high logic level "synthesis enable" signal which enables the operation of the first FLL by enabling AND gates 47 and 49 coupled to outputs of LO frequency sampler 31 as will be described below.

The contents of channel number register 41 are also coupled to a band decoder 50 which generates the band-switching signals for RF amplifier 3 and local oscillator 7 in accordance to the band of the selected channel.

During the operation of LO frequency sampler 31, before each measurement interval, the binary signals representing the number N generated by ROM 37 are loaded into the counter included within LO frequency sampler 31. During the measurement interval, the counter is enabled to count down from the number N in response to the frequency divided local oscillator signal generated by prescaler 33. The contents of the counter are reduced by one in response to each pulse of the frequency divided LO signal that occurs during the measurement interval. If the frequency of the LO signal is correct, the count contained in the counter at the end of the measurement interval will equal zero. However, if the frequency of the LO signal is low, the count at the end of the measurement interval will be high, i.e., will not have reached zero. Conversely, if the frequency of LO signal is high, the count at the end of the measurement interval will be high, i.e., will have traversed zero. When the count is high, a positive-going "high count" pulse is generated at a respective output of LO frequency sampler 31. When the count is low, a positive-going "low count" pulse is generated at a respective output of LO frequency sampler 31. The "high count" and "low count" outputs of LO frequency sampler 31 are coupled to respective inputs of AND gates 47 and 49. The outputs of AND gates 47 and 49 are coupled to inputs of OR gates 51 and 53, respectively. The outputs of OR gates 51 and 53 are coupled to "up" and "down" clock inputs, respectively, of an up/down counter 55. As earlier indicated, when the first FLL is enabled, the high logic level "synthesis enable" signal enables AND gates 47 and 49. As a result, the "low count" and "high count" pulses produced by LO frequency sampler 31 are enabled to reach the "up" and "down" clock inputs of up/down counter 55 during the "synthesis" operation.

The count contained in up/down counter 55 corresponds directly to the frequency of the local oscillator signal. The contents of up/down counter 55 are increased in response to the "low count" pulses and decreased in response to the "high count" pulses. The contents of up/down counter 55 are coupled to a binary rate multiplier (BRM) 57 which also receives the 4 mHz output signal from crystal oscillator 37. Binary rate multiplier 57 produces a pulse signal which includes, in a given time interval, a number of pulses directly related to the count contained in counter 55. The pulse signal produced by BRM 57 is filtered by a low pass filter (LPF) 59 to produce a DC signal which is amplified by an amplifier 61 to produce the tuning voltage.

The contents of up/down counter 55 and correspondingly the tuning voltage are changed in response to the "low count" and "high count" pulses produced by LO frequency sample 31 until the frequency of the LO signal is within a predetermined range, e.g., ±250 kHz for the implementation shown in FIG. 7. Tuning control unit 45, which is coupled to the outputs of AND gates 47 and 49 to receive the "high count" and "low count" pulses ends the high logic level "synthesis enable" signal and generates a high logic level "AFT enable" signal when the LO frequency is within the predetermined range. This causes the operation of the first FLL to be disabled and causes the operation of the second FLL to be enabled.

The second frequency locked loop is a digital AFT arrangement and includes an IF frequency sampler 63 which measures the frequency of the picture carrier of the IF signal by counting pulses of a frequency divided version of it during a measurement interval. For this reason, the output signal of IF amplifier 11 is divided by a frequency divider or prescaler 65 by a predetermined factor, e.g., 8, to produce a frequency divided version of the IF signal which is coupled to IF frequency sampler 63. The frequency divided version of the IF signal has one pulse for every 8 periods of the picture carrier of the IF signal. Since the picture carrier is the most dominant carrier in the IF signal, prescaler 65 will respond to it rather than the other components of the IF signal.

As will be described in greater detail with respect to FIG. 3, IF frequency sampler 63, includes a counter for counting the periods of the pulses of the frequency divided version of the IF signal during a measurement interval. Just prior to the measurement interval, a predetermined number corresponding to the nominal frequency of the picture carrier is loaded into the counter. A timing signal (64R) generated by counter 35 is coupled to IF frequency sampler 63 to establish its measurement interval. During the measurement interval, the counter counts down from the predetermined number in response to the frequency divided version of the IF signal produced by prescaler 65. If the counter reaches a count of zero during the measurement interval, the counter will "wrap around" so that a high count will be produced at the end of the measurement interval. If the frequency of the picture carrier is correct, a count will be equal to zero at the end of the measurement interval. If the frequency of the picture carrier is low, the count will be low at the end of the measurement interval and a "low count" pulse will be produced by IF frequency sampler 63. Conversely, if the frequency of the picture carrier is high the count will be high at the end of the measurement interval and a "high count" pulse will be produced by IF frequency sampler 63.

The "high count" output of IF frequency sampler is coupled to one input of an AND gate 67. The "low count" output of IF frequency sampler 63 is coupled to one input of an AND gate 69. AND gates 67 and 69 are enabled in response to the high logic level "AFT enable" signal generated by tuning control unit 43 to couple the "low count" and "high count" pulses produced by IF frequency sampler 63 to the "up" and "down" count inputs of up/down counter 55 through OR gates 51 and 53, respectively. In response to the "low count" and "high count" pulses produced by IF frequency sampler 63, the contents in up/down counter 55 and, correspondingly, the tuning voltage are modified to correct for a frequency deviation of the picture carrier of the IF signal.

Figure 2:
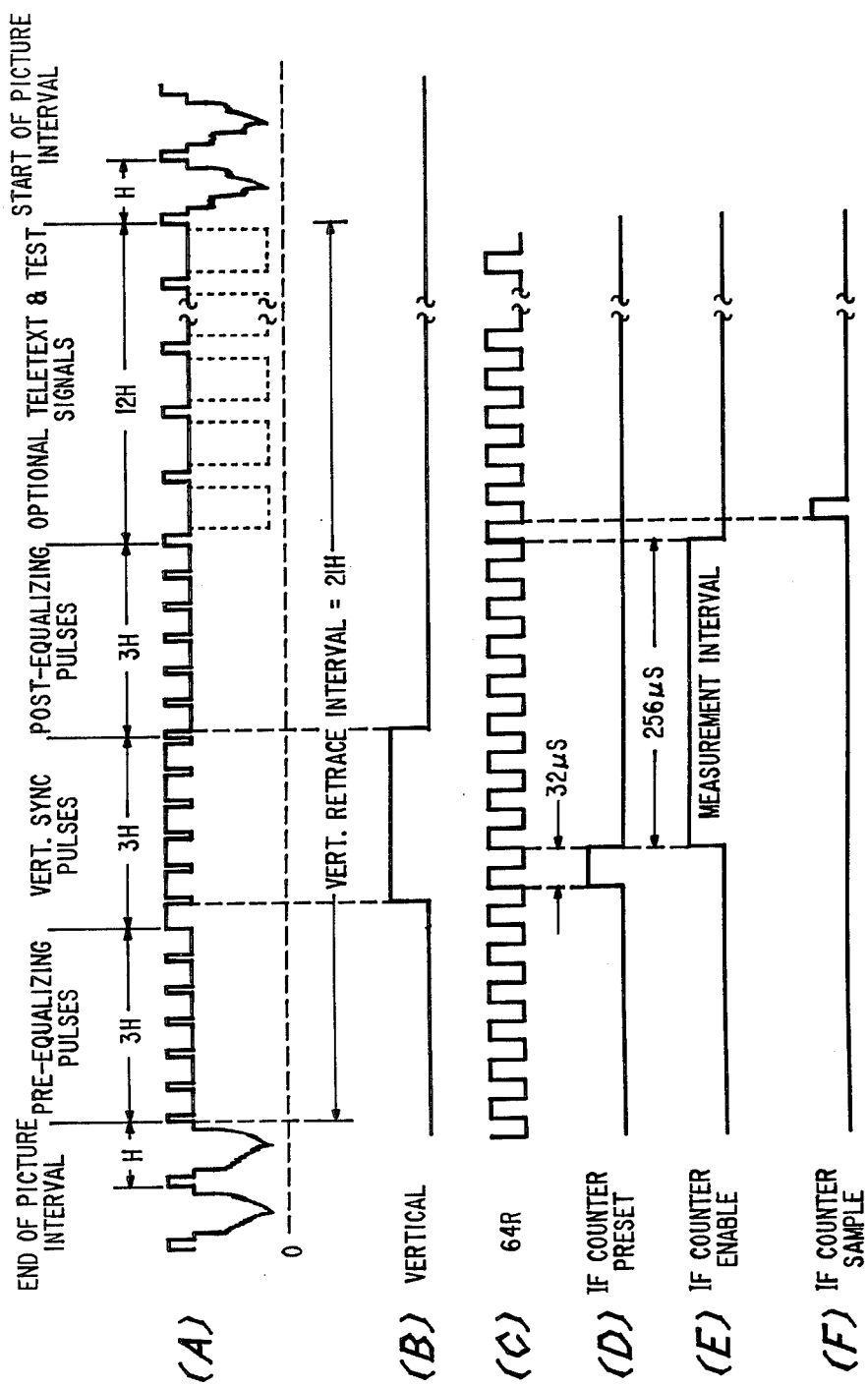
FIG. 2 shows graphical representation of a television signal and various timing signals useful in understanding the preferred embodiment shown in FIG. 1 and an implementation of a portion of the preferred embodiment shown in FIG. 3.

As indicated earlier, the picture carrier of the RF signal and therefore the picture carrier of the IF signal may be overmodulated during the picture interval which may produce a temporary interruption in the output signal of prescaler 65. As a result, the number of pulses counted during the measurement interval may be in error, i.e., too low. To overcome this, as earlier noted, in accordance with an aspect of the present invention, IF frequency sampler 63 is enabled to respond to the output signal of prescaler 65 during a predetermined portion of the vertical retrace or interval in which picture carrier of the RF signal, and therefore the picture carrier of the IF signal, tend not to be overmodulated and have relatively high and predictable amplitudes. This is indicated in the baseband video signal (waveform A) shown in FIG. 2. As a result, during the chosen portion of the vertical retrace interval the frequency divided version of the IF signal produced of prescaler 65 will be suitable for a reliable frequency measurement of the picture carrier of the IF signal.

Specifically, with respect to FIG. 1, a vertical pulse detector 71 is responsive to the composite synchronization signal generated by sync separator 17 to generate a "vertical" pulse (waveform B of FIG. 2) after the first vertical sync pulse in the vertical retrace interval. The "vertical" pulse is coupled to IF frequency sampler 63 to enable its operation. The measurement interval of IF frequency sampler 63 is desirably selected to end shortly before the portion of the vertical retrace interval reserved for teletext and test signals. This is done because the teletext and test signals may cause the IF picture carrier to be overmodulated as indicated by the dotted portions of waveform A of FIG. 2 in the teletext and test signal interval.

It is noted that the amplitude of the LO signal is unmodulated and therefore, unlike the IF signal, can be continuously sampled.

Since the measurement interval for the IF frequency measurement occurs at the vertical rate, e.g., every 16.7 milliseconds in the United States, the tuning voltage must be held nearly constant for a relatively long time duration in the absence of any frequency errors. The arrangement comprising up/down counter 55 and BRM 57 satisfies this requirement without the need for an excessively large filter capcitor in low pass filter 59.

As will be explained below with reference to FIG. 8, up/down counter 55 is controlled in response to "coarse tune", "medium tune" and "fine tune" control signals generated by tuning control unit 45 so that successively lower order stages of up/down counter 55 are enabled to respond to the error pulses in respective intervals of the synthesis mode of operation in order to minimize the time required to synthesize the nominal frequency of the LO signal. The "coarse tune", "medium tune" and "fine tune" control signals are generated by tuning control unit 45 in response to a change in the type error pulses generated by LO frequency sampler 31 (i.e., a change from "low count" to "high count" error pulses or from "high count" to "low count" error pulses. As will also be explained below with reference to FIG. 8, the time constant of low pass filter 59 caused to be lower in the synthesis mode of operation than in the AFT mode of operation in response to the "synthesis enable" and "AFT enable" signals in order to increase the response time of the first FLL.

During the AFT mode of operation, when the second FLL is enabled to operate, LO frequency sampler 31 continues to measure the frequency of the LO signal and is enabled, in response to the high logic level "AFT enable" signal, to generate a positive-going "offset" pulse if the count accumulated by the end of the measurement interval of LO frequency sampler 31 corresponds to a frequency offset greater than 1.25 mHz from the LO frequency established during the previous synthesis operation. In response to the "offset" pulse, tuning control unit 45 causes the high logic level "AFT enable" signal to end and again generates the high logic level "synthesis enable" signal. This causes AND gates 67 and 69 to be disabled and causes AND gates 45 and 47 to be enabled thereby disabling the operation of the second FLL and enabling the operation of the first FLL. This inhibits the frequency of the local oscillator signal from being tuned to an undesired carrier such as the sound carrier for the adjacent channel.

A logic implementation of IF frequency sampler 63 shown as a block in FIG. 1, is shown in FIG. 3. During the description of IF frequency sampler 63 shown in FIG. 3, reference to the waveforms shown in FIG. 2 will be helpful.

As earlier noted, vertical pulse detector 71 of the structure of FIG. 1 generates a positive-going "vertical" pulse (waveform B of FIG. 2) after the first vertical sync pulse during the vertical retrace interval. The "vertical" pulse is coupled to the data (D) input of a data type flip-flop (D FF) 301. The 64R timing signal, (waveform C) having a period of 32 microseconds is coupled to the clock (C) input of D FF 301. D FF 301 is set, i.e., its Q output is caused to have a logic high level, in response to the first positive-going edge of the 64R timing signal which occurs after the generation of the positive-going "vertical" pulse (waveform B).

The Q output of D FF 301 is coupled to the D input of a D FF 303. The 64R timing signal is coupled to the C input of D FF 301. D FF 303 is set, causing a low logic level to be developed at its $\overline{Q}$ output, in response to the second positive-going edge of the reference signal generated after the generation of the positive-going "vertical" pulse (waveform B). The Q output of D FF 301 and the $\overline{Q}$ output of D FF 303 are coupled to inputs of a NAND gate 305. Accordingly, a negative-going pulse, $\overline{D}$, having a width equal to the width of one cycle of the 64R timing signal, is generated at the output of NAND gate 305 after the first positive-going edge of the 31.25 kHz timing signal which occurs after the generation of positive-going "vertical" pulse (waveform B). The output of NAND gate 305 is applied to an inverter 307 which produces a positive-going pulse (waveform D) in response to negative-going pulse $\overline{D}$.

The positive-going pulse (waveform D) produced at the output of inverter 307 is applied to the preset (PR) input of a down counter 309. The latter causes the binary signals representing the number 1464 coupled to the jam inputs of down counter 309 to be loaded into down counter 309.

Negative-going pulse $\overline{D}$ is coupled to the C input of a D FF 311. A high logic level ("1") is applied to the D input of D FF 311. D FF 311 is set in response to the positive-going edge of negative-going pulse $\overline{D}$ causing a high logic level to be developed at its Q output (waveform E) and a low logic level to be developed at its $\overline{Q}$ output.

The signal (waveform E) produce at the Q output of D FF 311 is applied to the clock enable (CK EN) input of down counter 309. The output signal of prescaler 71 is applied to the clock (C) input of down counter 309. When the signal (waveform E) produced at the Q output of D FF 311 is at the high logic level, down counter 309 is enabled to count down from the number 1464. Thus, the duration of the high logic level of the Q output of D FF 311 (waveform E) is the duration of the measurement interval.

A "zero" count detector 313 is coupled to output of down counter 309 to detect when its count corresponds to the decimal number zero. Zero detector 313 may simply comprise a plural input NOR gate. If the contents of down counter 311 reach a count of zero during the measurement interval, "zero" detector 313 generates a high logic level at its output. The output of zero detector 313 is coupled to the C input of a D FF 315. A high logic level ("1") is coupled to the D input of D FF 315. D FF 315 will be set, causing a high logic level to be developed at its Q output, and a low logic level to be developed at its $\overline{Q}$ output if the frequency of the IF signal is high thereby causing counter 309 to reach a count of zero before the end of the measurement interval. The positive-going pulse (waveform D) generated at the output of inverter 307 is coupled to the reset (R) input of D FF 315 to cause it to be reset just prior to the measurement interval.

The duration of the measurement interval is determined by a four stage binary counter 319. Counter 319 counts in response to the 64R timing signal coupled to its clock (C) input. When eight periods of the 64R timing signal have been counted, a high logic level is developed at the output of its fourth stage (Q4). The Q4 output of counter 319 is coupled to the reset (R) input of D FF 311. In response to the positive-going edge of the signal generated at the Q4 output of counter 319, D FF 311 is reset thereby causing a low logic level to be developed at its Q output (waveform E) and ending the measurement interval. Since each period of the 64R timing signal is 32 microseconds long, the measurement interval is 8×32 or 256 microseconds long.

At the end of the counting interval the contents of counter 309 are sampled to evaluate the accumulated count and therefore the frequency of the IF signal. For that purpose, positive-going sample pulse (waveform F) is generated by a D FF 321, an AND gate 323 and an inverter 325. The $\overline{Q}$ output of D FF 311 is coupled to the C input of D FF 321. A high logic level ("1") is coupled to the D input of D FF 321. In response to the positive-going edge produced at the $\overline{Q}$ output of D FF 311 when the measurement interval (waveform E) ends, a high logic level is developed at the Q output of D FF 321. The signal produced at the output (Q1) of the first stage of counter 319 is coupled to the reset input of D FF 321. Accordingly, D FF 321 is reset ending the high logic level at its Q one cycle of the 64R timing signal after the end of the measurement interval. The Q output of D FF 321 is coupled to one input of AND gate 323. The 64R timing signal is inverted by inverter 325 and the resulting signal coupled to the other input of AND gate 323. As a result, a positive-going sample pulse (waveform F) having a width equal to the width of one pulse of the 64R signal, is generated after the measurement interval ends.

The sample pulse (waveform F) is coupled to first inputs of AND gates 327 and 329. The output signal of zero detector 313 is inverted by an inverter 331 and the resulting signal is coupled to a second input of AND gate 329. The $\overline{Q}$ output of D FF 315 is coupled to a second input of AND gate 327 and the Q output of D FF 315 is coupled to a third input of AND gate 329.

If the frequency of the IF signal is high, down counter 309 will have counted through zero during the measurement interval. Accordingly, D FF 315 will be set at the end of the measurement interval. As a result, AND gate 327 will be disabled and AND gate 329 will be enabled when the positive-going sample pulse (waveform F) occurs just after the end of the measurement interval. The positive-going sample pulse will be coupled through enabled AND gate 329 as the "high count" pulse.

If the frequency of the IF signal is low, counter 309 will not have counted through zero by the end of the measurement interval. As a result, at the end of the measurement interval, D FF 315 will not be set. Accordingly, AND gate 327 will be enabled and AND gate 329 is disabled when the positive-going sample pulse (waveform F) occurs just after the end of the measurement interval. The sample pulse will be coupled through enabled AND gate 327 as the "low count" pulse.

If the frequency of the IF signal is correct the count will be exactly zero at the end of the measurement interval. Since the zero count will have been reached by the end of the measurement interval, D FF 315 will be set at the end of the measurement interval. As a result, AND gate 327 will be disabled and no "low count" will be produced. Since the count will be zero when the sample pulse occurs just after the end of the measurement interval, zero detector 313 will produce a high logic level and inverter 331 will produce a corresponding low logic level which will disable AND gate 329 (which would otherwise be enabled in response to the high logic level at the Q output of D FF 315). As a result, no "high count" pulse will be produced at the output of AND gate 329 in response to the sample pulse.

It is noted that the beginning of the measurement interval (waveform E) is not synchronized with the output of prescaler 65. Accordingly, although 1464 positive edges may be counted, there may be a ±31.25 kHz frequency error corresponding to as much as one period of the output signal of prescaler 65. This accuracy has been found sufficient for tuning television receivers. The accuracy of the IF frequency measurement can be improved by either decreasing the division factor of prescaler 65 or by increasing the time duration of the measurement interval. The former is somewhat undesirable since it increases the frequency of the signal which LO frequency sampler 31 must process. The latter is also somewhat undesirable since it may cause the measurement interval to extend into the teletext and test signal interval in which the IF picture carrier may, under some circumstances, be overmodulated.

A logic implementation of vertical synchronization pulse detector 71 shown as a block in FIGS. 1 and 3 is shown in FIG. 4. During the description of FIG. 4 reference to the waveforms shown in FIG. 5 will be helpful.

The implementation of vertical synchronization pulse detector 71 shown in FIG. 4 includes two two-stage resettable binary counters 401 and 403. The 256R timing signal, having an eight microsecond period, is coupled to the clock (C) input of counters 401 and 403. The composite synchronization signal including horizontal and vertical synchronization and equalizing pulses is coupled to the reset (R) input of counter 401 and to the input of an inverter 405. The output of inverter 405 is coupled to the reset (R) input of counter 403.

The intervals between the consecutive positive-going, relatively narrow pulses of the output signal of inverter 405 correspond to the durations of the relatively broad, positive-going vertical sync pulses which occur during the vertical retrace interval. As will be seen from FIG. 5, the duration of one vertical sync pulse approximately corresponds to the duration of three consecutive cycles of the 256R timing signal. Counter 403 is held reset in response to the high logic level of each positive-going pulse of the output signal of inverter 405. Thus, the presence of vertical sync pulses is indicated if three positive-going clock pulses are counted by counter 403 between consecutive positive-going reset pulses. To detect this occurrence, the outputs of the first and second stages of counter 403, Q1 and Q2, are coupled to inputs of an AND gate 407. When the signals developed at the Q1 and Q2 outputs of counter 403 both have high logic levels, AND gate 407 will produce a high logic level at its output. The output of AND gate 407 is coupled to the set (S) input of a S-R FF 409. The high logic level produced at the output of AND gate 407 causes S-R FF 409 to be set, thereby producing a high logic level at its Q output. The Q output of S-R FF 409 is coupled to one input of an AND gate 413. The output of a "sync validity" detector 415 is coupled to the other input of AND gate 413. The "vertical" pulse is produced at the output of AND gate 413 when S-R FF 409 is set and the high logic level is produced at the output of "sync validity" detector 415 as will be described below.

As will be seen from FIG. 5, the interval between consecutive relatively narrow, positive-going post-equalizing pulses (as well as the interval between the consecutive relatively narrow, positive-going pre-equalizing pulses) approximately correspond to the duration of three consecutive cycles of the 256R timing signal. Counter 401 and an AND gate 411 are arranged in similar fashion to counter 403 and AND gate 407 to generate the high logic level when three clock pulses have been counted between two consecutive positive-going post-equalizing pulses and thereby detect the beginning of the post-equalizing interval. The output of AND gate 411 is coupled to the reset (R) input of S-R FF 409 to reset it, thereby ending the high logic level produced at the Q output of S-R FF 409.

It is noted that some sources of RF television signals, such as video games, may not provide pre-equalizing and post-equalizing pulses. However, the structure shown in FIG. 4 will operate in substantially the same manner described except that S-R FF 409 will be reset when three clock pulses are counted by counter 401 between consecutive horizontal sync pulses rather than between consecutive post-equalizing pulses.

Sync validity detector 415 is responsive to the composite sync signal and generates the high logic level output signal which enables AND gate 413 to couple the "vertical" pulse to IF frequency sampler 63 when the composite sync signal is correct and relatively noise-free. For this purpose "sync validity" detector 415 may simply comprise an average detector. Another suitable arrangement for "sync validity" detector 415 which operates by examining the frequency and period of the composite sync signal to determine its validity is described in allowed U.S. patent application No. 261,449 now U.S. Pat. No. 4,364,094 filed on May 8, 1981 in the name of M. P. French and J. Tults and assigned, like the present application, to RCA Corporation. In relatively noise-free environments detector 415 and AND gate 413 may be omitted. In that case the "vertical" pulse is directly produced at the Q output of S-R FF 409.

A logic implementation of the LO frequency sampler 31 shown as a block in FIG. 1 is shown in FIG. 6. FIG. 7 illustrates signal waveforms useful in understanding the operation of the structure of FIG. 6.

LO frequency sampler 31 shown in FIG. 6 is somewhat similar in structure and operation to IF frequency sampler 63 shown in FIG. 3. However, since the local oscillator signal is unmodulated and therefore has a relatively constant amplitude, LO frequency sampler 31 measures the frequency of the LO signal continuously, i.e., not only during the vertical retrace interval as is the case for IF frequency sampler 63. The logic implementation LO frequency sampler 31 shown in FIG. 6 includes a down counter 601 which receives binary signals representing a number N from ROM 39 at its "jam" inputs. The number N is equal to four times the frequency of the LO signal, in mHz, of the selected channel. Thus, for example, for channel 2, the factor N is equal to 4×101 or 404. Timing signals 4R, 2R and R having periods successively longer by factors of two as shown in FIG. 7, are coupled to LO frequency sampler 31 from reference counter 35 of the structure shown in FIG. 1. An inverter 603 and an AND gate 605 combine the R and 2R timing signals to generate periodic positive-going preset pulses which are coupled to the preset (PR) input of down counter 601. In response to each of these preset pulses, the binary signals representing the number N are loaded into down counter 601.

The R timing signal is coupled to the clock enable input (CK. EN.) of down counter 601 and the output signal of prescaler 33 is coupled to its clock (C) input. In response to the high logic levels of the R timing signal down counter 601 is enabled to count down from the number N in response to the positive-going pulses of the output signal of prescaler 33. Thus, the measurement interval of LO frequency sampler 31 correspond to the duration of the positive-going pulses of the R timing signal. As shown in FIG. 7, the measurement interval is 1024 microseconds in duration.

Inverter 603, an inverter 607 and AND gate 609 combine the R, 2R and 4R timing signals to generate a positive-going sample pulse after each measurement interval. The sample pulses are coupled to first inputs of AND gates 611 and 613. A "zero count" detector 615 generates a high logic level output signal when the count in down counter 601 accumulated during the measurement interval equals zero. The output of zero counter 615 is coupled to the C input of a D FF 617. A high logic level ("1") is coupled to the D input of D FF 617. The Q output of D FF 617 is coupled to a second input of AND gate 613 and the $\overline{Q}$ output of D FF 617 is coupled to a second input of AND gate 611. The preset pulses generated at the output of AND gate 605 are coupled to the reset input of D FF 617 so that it is reset prior to the measurement interval.

Down counter 601, AND gates 611 and 613, zero detector 615 and D FF 617 cooperate in substantially the same manner as corresponding elements of IF frequency sampler 63 to produce a "low count" or a "high count" pulse after the end of the measurement interval in response to the sample pulse if the LO frequency is high or low, respectively. However, if the LO frequency is correct, a "high count" pulse will nevertheless be produced because D FF 617 will be set by the end of the measurement interval thereby enabling AND gate 613 to respond to the sample pulse (note the absence of an inverter corresponding to inverter 331 of the structure shown in FIG. 3). Thus, either a "low count" or "high count" pulse will always be produced by LO frequency sampler 31. This causes the tuning voltage to overshoot its final or correct value. This occurrence is detected by control unit 45, which detects the corresponding change in the type of error pulse being produced by LO frequency sampler 30, in order to generate the "coarse tune", "medium tune" and "fine tune" control signals as will be described with reference to FIG. 9.

Since the measurement interval of LO frequency sampler 31 is four times longer than the measurement interval of IF frequency sampler 63, (i.e., 1024 microseconds versus 256 microseconds) and the division factor of prescaler 33 is thirty-two times greater than the division factor of prescaler 65 (i.e., 256 versus 8), the accuracy of LO frequency sampler 31 is 32/4 or 8 worse that of IF frequency sampler 63 (i.e., ±250 kHz versus ±31.25 Hz). The accuracy of ±250 Hz has been found adequate for tuning the LO signal to the nominal frequency for the selected channel before enabling the operation of the second or AFT FLL.

As earlier noted, LO frequency sampler 31 also serves to examine the LO frequency during the operation of the AFT FLL to determine if the LO frequency has been caused to change from the value established during the previous operation of the synthesis FLL by a predetermined offset, e.g., ±1.25 mHz. The remaining structure shown in FIG. 6 generates a positive-going "offset" pulse if the LO frequency has been caused to change from the value established during the previous operation of the synthesis FLL by more than ±1.25 mHz. Since each count in down counter 601 corresponds to a 0.250 mHz increment, the detection of a frequency offset greater than ±1.25 mHz requires the detection of a count within ±5 counts of zero.

For the latter purpose, the structure shown in FIG. 6 includes a "greater than five" (">5") detector 623 which generates a high logic level output signal if the count in down counter 601 is greater than five at the end of the measurement interval. The output signal of ">5" detector 623 is coupled to one input of an AND gate 625 which also receives the signal developed at the $\overline{Q}$ output of D FF 617, the sample pulse and the "AFT enable" signal at respective other inputs. When enabled by the high logic level "AFT enable" signal, AND gate 625 generates a positive-going pulse in response to the positive-going "sample" pulse if the count in counter 601 at the end of the measurement interval is greater than five above zero. Since after down counter 601 has counted down to zero it continues to count down from the maximum count, coupling the $\overline{Q}$ output signal of D FF 617 to an input of AND gate 625 ensures that a positive-going pulse will not be produced by AND gate 625 in response to the sample pulse unless the count is actually greater than five above zero and not in response to the detection of a large count in counter 601 at the end of the measurement interval due to the count having crossed zero.

Another detector 629 generates a high level logic output signal if down counter 601 has counted five counts below zero during the measurement interval. Since the next count produced by down counter 601 after a count of zero is reached is the maximum count to which the counter can count, detector 629 operates by detecting when the count in counter 601 falls below four less than the maximum count (<MAX−4). The output of detector 627 is coupled to the one input of an AND gate 629 which also receives the signal developed at the Q output of D FF 617, the sample pulse and the "AFT enable" signal at respective other inputs. When enabled by the high logic level "AFT enable" signal, AND gate 629 generates a positive-going pulse in response to the positive-going sample pulse of the count in counter 601 at the end of the measurement interval is less than four below the maximum count. Since the operation of LO frequency sampler 31 starts by enabling counter 601 to count down from the relatively large number N, coupling the Q output signal of D FF 617 to an input of AND gate 629 ensures that a positive-going pulse will not be produced by AND gate 629 in response to the sample pulse unless the count has previously crossed zero and therefore actually is more than five below zero.

The outputs of AND gates 625 and 629 are coupled to respective inputs of an OR gate 631. The positive-going offset pulse is generated at the output of OR gate 631 when a positive-going pulse is generated at the output of either one of AND gates 625 and 629.

Referring now to FIG. 8, a specific implementation of the structure including BRM 57, low pass filter 59 and up-down counter 55 will now be described.

The number of stages in BRM 57 is selected to ensure that the tuning voltage steps do not produce LO frequency steps that result in visible interference in the reproduced image. By way of example, it has been found that in a single conversion or single heterodyne voltage controlled tuner, tuning voltage changes resulting in periodic LO frequency fluctuations less than 50 kHz tend not to produce visible interference in the reproduced image. The highest sensitivity to tuning voltage changes occurs in the UHF band (channels 14 through 83 in the United States) where the slope of the frequency versus tuning voltage characteristic can be as large as 30 mHz per volt. Accordingly, it is desirable to limit the change in tuning voltage per frequency correction step to:

0.05 mHz×1 volt/30 mHz≅1.7 millivolt

Assuming the total tuning voltage range to extend from zero volts to twenty-seven volts, the required number of tuning steps using the maximum desired tuning voltage change per step calculated above is:

$$\frac{27 \text{ volts}}{1.7 \times 10^{-3} \text{ volts}} = 15882$$

Since a fourteen stage binary rate multiplier has 16384 states, BRM 57 is selected to have fourteen stages. The frequency of the clock signal for BRM 57 is selected to provide enough time for BRM 57 to complete its operating cycle and for the tuning voltage to change between the error pulses which occur once every field during the AFT mode of operation.

By way of example, if, as shown in FIGS. 1 and 8, the clock for BRM 57 is selected to have a frequency of 4 mHz or a period of 0.25 microseconds, the time required for one operating cycle of BRM 57 having 16384 states is:

$$16384 \text{ steps} \times \frac{0.25 \text{ microseconds}}{\text{step}} \cong 4 \text{ milliseconds}$$

In the AFT mode of operation when the AFT FLL is enabled to operate, the correction pulses occur once every field, e.g., once every 16.7 milliseconds in the United States. Thus, selecting a 4 mHz clock for BRM 57 allows adequate time between the correction pulses for BRM 57 to complete an operating cycle and for the tuning voltage to change in response to the resulting change in the output signal of BRM 57. As will be described below, the synthesis mode of operation is partitioned into coarse, medium and fine tuning intervals in each of which the number of BRM states that can be changed is limited in order to ensure that the 4 mHz clock signal will allow for adequate time for the tuning voltage to change between error pulses.

Furthermore, selecting a 4 mHz clock for BRM 57, allows for the use of practical resistance and capacitance values for low pass filter (LPF) 59, as indicated in FIG. 8, consistent with ensuring that the worst case ripple in the tuning voltage will produce LO frequency fluctuations considerably less than those (e.g., 50 kHz fluctuations) which may result in visible interference.

Binary rate multiplier 57 may be constructed in a manner similar to a CD 4089 integrated circuit binary rate multiplier commercially available from RCA Corporation, Somerville, N.J.

Referring now to the implementation of low pass filter shown in FIG. 8, the output signal of BRM 57 is coupled to first inputs of AND gates 801 and 803. The "synthesis enable" control signal is coupled to the second input of AND gate 801 and the "AFT enable" control signal is coupled to the second input of AND gate 803. During the synthesis mode of operation the "synthesis enable" signal is at the high logic level thereby enabling AND gate 801 to couple the output signal of BRM 57 to a first low pass filter section of low pass filter 59 consisting of a resistor 805 and a capacitor 807. During the AFT mode of operation, the "AFT enable" signal is at the high logic level thereby enabling AND gate 803 to couple the output signal of BRM 57 to a second low pass filter section of low pass filter 59 consisting of a resistor 809 and capacitor 807. The junction of resistors 805 and 809 and capacitor 807 is coupled to the input of amplifier 61 which amplifies the DC voltage produced by low pass filter 59 as was indicated with respect to FIG. 1. Since the structure of low pass filter 59 is relatively simple, consisting simply of two resistors and a capacitor, a significant cost saving over that of the more complicated active low pass filter arrangements typically employed in phase lock loop tuning control systems, is achieved.

The implementation of up/down counter 55 shown in FIG. 8 is a fourteen-stage counter arrangement in which a two-stage up/down counter 55a, a four-stage up/down counter 55b, a four-stage up/down counter 55c and a four-stage up/down counter 55d are coupled in cascade, with the carry-out (CO) outputs of up/down counters 55a 55b and 55c coupled through OR gates 811a, 811b and 811c to the carry-in (CI) inputs of up/down counters 55b, 55c and 55d, respectively. Counters 55a–55d may be constructed in a manner similar to a CD 4516 integrated circuit binary up/down counter commercially available from RCA Corporation, Somerville, N.J.

The "low count" or "high count" error pulses from the enabled one of LO frequency sampler 31 or IF frequency sampler 63 are coupled through a NOR gate 813 directly to the clock (C) input of up/down counter 55d and selectively to the clock inputs of up/down counters 55c, 55b and 55a through NOR gate 813 and AND gates 815c, 815b and 815a, respectively. The "coarse tune", "medium tune" and "fine tune" control signals are inverted by inverters 817c, 817b and 817a and the resulting signals are coupled to inputs of AND gates 815c, 815b and 815a, respectively. Accordingly, AND gates 815c, 815b and 815a are selectively disabled to couple the error pulses to the respective clock inputs in response to the high logic levels of "coarse tune", "medium tune" and "fine tune" control signals generated by tuning control unit 45.

When the "coarse tune" control signal has the high logic level, AND gates 815c, 815b and 815a are disabled and the error pulses are only coupled to the clock input of counter 55d. When the "medium tune" control signal has a high logic level, AND gates 815b and 815a are disabled and the error pulses are coupled only to the clock inputs of counters 55d and 55c. When the "fine tune" control signal has high logic level, AND gate 815a is disabled and the error pulses are coupled only to the clock inputs of counters 55d, 55c and 55b. When none of the "coarse tune", "medium tune" or "fine tune" control signals has a high logic level, the error pulses are coupled to the clock inputs of all of counters 55d, 55c, 55b and 55a. The "coarse tune", "medium tune" and "fine tune" control signals are also coupled to inputs of OR gates 811c, 811b and 811a and when at the high logic level provide high logic level carry-in signals to the carry-in inputs of counters 55d, 55c and 55b, respectively. As will be described in greater detail with respect to the structure of FIG. 9, the structure of tuning control unit 45 causes the "coarse tune", "medium tune" and "fine tune" control signals to have the high logic level during successive intervals as indicated in FIG. 10. During the AFT mode of operation, all of the control signals are caused to have low logic levels so that the full fourteen bit resolution of counter 55 is available.

A S-R FF 819 receives the "high count" error pulses at its set (S) input and the "low count", error pulses at its reset (R) input and has its Q output coupled to the "up/down" control inputs of counters 55a–55d. When "high count" error pulses are generated, S-R FF 819 is set causing a high logic level to be developed at its Q output. When "low count" error pulses are generated, S-R FF 819 is reset causing a low logic level to be developed at its Q output. When a high logic level is developed at the Q output of S-R FF 819, the contents of counters 55a–55d are caused to increase in response to the error pulses. When a low logic level is developed at the Q output of S-R FF 819, the contents of counters 55a–55d are caused to decrease in response to the error pulses.

The partitioned arrangement of counter 55 causes groups of successively lower order bits of up/down counter 55 to control the number of pulses produced by BRM 59 and thereby the magnitude of the tuning voltage. The purpose of this is to divide the time interval in which the first or synthesis FLL operates into three time intervals in each of which the maximum number of tuning voltage steps is limited to sixteen. As a result, the time required to reach the final tuning voltage in the synthesis mode of operation is:

$3 \times 16x$ (the time required for one tuning voltage step)

If counter 55 were not partitioned, the time required to reach the final tuning voltage could be as long as the time required to make $2^{14}$ or 16384 steps. Thus, the partitioned arrangement of counter 55 considerably shortens the time required to reach the final tuning voltage during the synthesis mode of operation.

A logic implementation of tuning control logic unit 45 shown in block form in FIG. 1 is shown in FIG. 9. During the description of the structure of FIG. 9 reference to the waveforms shown in FIG. 10 will be helpful.

In the structure of FIG. 9, the logic configuration comprising an AND gate 901 and D FFs 903 and 905 selects one of the "preset" pulses generated at the output of AND gate 605 of the logic implementation of LO frequency sampler 31 shown in FIG. 6 to produce a "start" pulse after a new channel is selected. Specifically, the "preset" pulses are coupled to one input of AND gate 901 and the "new channel" signal generated by channel selector 43 of the structure shown in FIG. 1 when a new channel has been entered is coupled to the D input of D FF 903. The "sample" pulse generated at the output of AND gate 609 of the logic implementation of LO frequency samples shown in FIG. 6 is coupled to the clock input of D FF's 903 and 905. The Q output of D FF 903 is coupled to the D input of D FF 905. The Q output of D FF 903 is coupled to a second input of AND gate 901 and the $\overline{Q}$ output of D FF 905 is applied to a third input of AND gate 901. In response to the first LO counter sample pulse which occurs after the generation of the high logic level "new channel" signal, D FF 903 is set and D FF 905 is set and AND gate 901 is enabled. In response to the second LO counter sample pulse which occurs after the generation of the high logic level "new channel" signal, D FF 905 is set (the state of D FF 903 remains unchanged) and AND gate 901 is disabled. As a result AND gate 901 is enabled for a time interval long enough to allow just one "preset" pulse to be coupled from its input to its output as the "start" pulse as indicated in FIG. 10.

The "start" pulse is coupled to one set (S) input of a S-R FF 907 which in response generates the high logic level "synthesis enable" signal at its Q output.

The "start" pulse is also coupled to respective set (S) inputs of S-R FFs 909 and 911. S-R FF 909 is set in response to the positive-going "start" pulse to initiate a positive-going "reset" pulse at its Q output. The $\overline{Q}$ output of S-R FF 911 is coupled to one input of an AND gate 913. The R timing signal is coupled to a second input of AND gate 913. The output of AND gate 913 is coupled to the reset (R) input of S-R FF 909. Since S-R 911 is also set in response to the positive-going "start" pulse which causes a low logic level to be developed at its $\overline{Q}$ output. AND gate 913 is disabled from coupling the pulses of the R timing signal to the reset input of S-R FF 909 until S-R FF 911 is reset. S-R FF 911 receives the "sample" pulses at its reset input. Accordingly, S-R FF 911 is reset and AND gate 913 enabled in response to the first "sample" pulse which occurs after the "start" pulse. As a result, the next positive-going pulse of the R timing signal is coupled to the reset input of S-R flip-flop 909, thereby ending the positive-going "reset" pulse. As is shown in FIG. 10, the reset pulse spans one "sample" pulse. The purpose of this will be described below.

A S-R FF 915, a D FF 917 and a D FF 919 together with a NOR gate 921, an exclusive OR gate 923 and a NOR gate 925 generate the "coarse tune", "medium tune" and "fine tune" control signals for the structure shown in FIG. 8. Basically, the latter structure causes the "coarse tune" "medium tune" and "fine tune" control signals to have the high logic level one at a time in sequence after a new channel is selected. More specifically, the "coarse tune" control signal is caused to have the high logic level in response to the "new channel" signal and thereafter the "medium tune" and "fine tune" control signals are caused to have the high logic level one at a time in sequence in response to respective changes in the sense of the frequency error detected by LO frequency sampler 31 as manifested by corresponding alternate generations of the "low count" and "high count" pulses.

Referring now specifically to the structure shown in FIG. 9, the "low count" and "high count" error pulses generated by LO frequency sampler 31 are coupled to the set (S) and reset (R) inputs, respectively, of S-R FF 915. The $\overline{Q}$ and Q outputs of S-R FF 915 are coupled to the clock (C) inputs of D FFs 917 and 919, respectively. The respective $\overline{Q}$ outputs and D inputs of D FFs 917 and 919 are coupled together to configure D FFs 917 and 919 as "toggle" flip-flops. The "reset" pulse is coupled to the reset inputs of D FFs 917 and 919. The "AFT enable" signal generated at the $\overline{Q}$ output of S-R FF 907 is coupled to the set inputs of D FFs 917 and 919. The output signal developed at the Q output of D FF 917, identified as A, is coupled to a first input of NOR gate 921 and to a first input of exclusive OR (XOR) gate 923 and the signal developed at the $\overline{Q}$ output of D FF 917, identified as $\overline{A}$, is coupled to a first input of NOR gate 925. The signal developed at the Q output of D FF 919, identified as B, is coupled to a second input of NOR gate 921 and to a second input of XOR gate 923 and the signal developed at the $\overline{Q}$ output of D FF 919, identified as $\overline{B}$, is coupled to a second input of NOR gate 925. The "AFT enable" signal is coupled to a third input of NOR gate 925.

During the AFT mode of operation, when the "AFT enable" signal has the high logic level, NOR gate 925 is disabled from responding to the $\overline{A}$ and $\overline{B}$ signals since it always produces the low logic level at its output in response to the high logic level "AFT enable" signal. During the synthesis mode of operation, when the "AFT enable" signal has the low logic level, NOR gate 925 is enabled to respond to the levels of the $\overline{A}$ and $\overline{B}$ signals. The "coarse tune" signal is developed at the output of NOR gate 921. The "medium tune" signal is developed at the output of XOR gate 923. The "fine tune" signal is developed at the output of NOR gate 925.

The positive-going "reset" pulse generated in response to the high logic level "new channel" signal causes both of D FFs 917 and 919 to be reset. As a result, the signals A and B are both at the low logic level and low logic levels in response to the "positive-going" reset the "coarse tune" signal, developed at the output of NOR gate 921, has the high logic level. At the same time, the "medium tune" signal, developed at the output of XOR gate 923, is at the low logic level and the "fine tune" signal, developed at the output of NOR gate 925, is at the low logic level.

During the coarse tuning interval the frequency of the local oscillator signal will be either higher or lower than it should be and either "low count" or "high count" error pulses, respectively, will be consecutively generated. By way of example, it is assumed that the LO frequency is lower than it should be after a new channel is selected so that "low count" error pulses are generated as is indicated in FIG. 10. Thereafter, the operation of the LO frequency sampler 31 in conjunction with up/down counter 55, BRM 57, LPF 59 and amplifier 61 causes the tuning voltage and thereby the LO frequency to increase when the frequency of the LO signal overshoots its final or correct value, "high count" rather than "low count" error pulses will be generated. This causes S-R FF 915 to be reset thereby causing a positive-going pulse to be produced at its $\overline{Q}$ output. This causes D FF 917 to be set thereby causing the A signal to have the high logic level and the $\overline{A}$ signal to have the low logic level. At this point, B still has the low logic level and $\overline{B}$ still has the high logic level. As a result, the "coarse tune" signal has the low logic level, the "medium tune" signal has the high logic level and the "fine tune" signal has the low logic level.

In response to the "high count" error pulses, the LO frequency is caused to decrease. When the frequency of the LO signal again overshoots its final value, "low count" error pulses will once again be generated instead of "high count" error pulses. This again causes S-R FF 915 and D FF 919 to be set so that A and B are both at the high logic level and $\overline{A}$ and $\overline{B}$ are both at the low logic level. As a result, the "coarse tune" and "medium tune" signals will be at the low logic level and the "fine tune" signal will be at the high logic level.

As earlier noted, the logic including the structural elements 901 through 913 cause the "reset" pulse to span the first "sample" pulse and therefore the first "high count" or "low count" error pulse generated after the generation of the high logic level "new channel" signal. This ensures that the states of FFs 917 and 919 will not be changed until the sense of the frequency correction changes under normal operating conditions. If the "reset" pulse were not to span the first error pulse, a change from one type of error pulse to the other could occur immediately after the selection of a new channel due to initially eratic operating conditions. This would cause the states of S-R FF 915 and one of D FFs 917 and 919 to change thereby upsetting the proper generation sequence for the "coarse tune", "medium tune" and "fine tune" control signals.

The output of NOR gate 925 is applied to the set input of a S-R FF 927. The Q output of S-R FF 927 is coupled to one input of an AND gate 929. The output of NOR gate 925 is also coupled to the input of an inverter 931, the output of which is coupled to a second input of AND gate 929. The output of AND gate 929 is coupled to the reset input of S-R FF 907. As earlier noted, the "synthesis enable" signal is developed at the Q output of S-R FF 907 and the "AFT enable" signal is developed at the $\overline{Q}$ output of S-R FF 907. In response to the high logic level "fine tune" signal, S-R FF 927 is set causing its Q output to have the high logic level which enables AND gate 929. When the "fine tune" signal is caused to have the low logic level, a corresponding high logic level is developed by inverter 931 and coupled through enabled AND gate 929 to the reset input of S-R FF 907. The latter causes the "AFT enable" signal developed at the $\overline{Q}$ output of S-R FF 907 to have the high logic level. The "start" pulse is coupled to the reset input of S-R FF 927 and causes S-R FF 927 to be reset. This disables AND gate 929 and thereby prevents the development of the low logic level at the output of NOR gate 925 during the synthesis mode of operation from causing S-R FF 907 to be reset until after the generation of the high logic level "fine tune" signal.

The high logic level "AFT enable" signal causes D FFs 917 and 919 to remain set during the AFT mode of operation. As a result, A and B remain at the high logic level and $\overline{A}$ and $\overline{B}$ remain at the low logic level during the AFT mode of operation. As earlier indicated, the high logic level "AFT enable" signal also disables NOR gate 925 from responding to signals $\overline{A}$ and $\overline{B}$ by causing its output to have the low logic level. As a result, during the AFT mode, all of the "coarse tune", "medium tune" and "fine tune" control signals have the low logic level during the AFT mode of operation.

The "offset" signal is coupled to a second set (S) input of S-R FF 907. S-R FF 907 is set in response to the positive-going "offset" pulse thereby causing the "synthesis enable" signal to have the high logic level and the "AFT enable" signal to have the low logic level. This ends the AFT mode of operation and reinitiates the synthesis mode of operation. In response to the low logic level "AFT enable" signal, NOR gate 925 is enabled to respond to the $\overline{A}$ and $\overline{B}$ signals which are at the low logic level (having been caused to be in that condition in response to the high logic level "AFT enable" signal). As a result, the "fine tune" control signal is caused to be at the high logic level. Thereafter, when the LO frequency overshoots its final value, one of D FFs 917 and 919 is reset. This causes the "fine tune" signal to have the low logic level. As a result, as described above when the high logic level of the "fine tune" signal ends, S-R FF 907 is reset causing the "AFT enable" signal to have the high logic level and the "synthesis enable" signal to have the low logic level.

While the present invention has been described in terms of a frequency locked loop tuning system, it may also be employed in a phase locked loop tuning system, e.g., of the type described in U.S. Pat. No. 4,078,212 entitled "Dual Mode Frequency Synthesizer for a Television Tuning Apparatus", issued in the name of R. M. Rast on Mar. 7, 1978. In addition, while in the specific embodiment described, the frequency measurement of the IF picture was made during the vertical retrace synchronization interval, it is also contemplated that it may be made during the horizontal retrace synchronization interval. Furthermore, while separate counters are utilized measuring the LO and IF frequencies in the specific embodiment described, a commonly shared counter arrangement, such as described in U.S. patent application Ser. No. 413,762 entitled "A Shared Counter Arrangement for a Digital Frequency Locked Loop Tuning System for Selectively Measuring the Frequencies of the LO and IF Signals", concurrently filed with the present application also in the name of J. Tults and assigned to the same assignee, may be utilized. These and other modifications are contemplated to be within the scope of the present invention defined by the following claims.

What is claimed is:

1. Tuning control apparatus for a television system of the type including an input for RF television signals corresponding to respective channels, each RF signal having a picture carrier modulated with video information including picture information in picture intervals occurring between horizontal retrace intervals themselves occuring between vertical retrace intervals; and RF stage for selecting one of said RF signals corresponding to a selected channel in response to a tuning control signal; a local oscillator for generating a local oscillator (LO) signal having a frequency related to said selected channel in response to said tuning control signal; a mixer for combining said local oscillator signal and said selected RF signal to produce an IF signal having a picture carrier modulated in the same manner as the picture carrier of said selected RF signal; picture processing means responsive to said IF signal for producing a picture signal representing said picture information contained in said picture intervals; and synchronization processing means responsive to said IF signal for producing horizontal and vertical synchronization signals representing the occurrence of said horizontal and vertical retrace intervals, respectively; comprising:

tuning control signal generating means for generating said tuning control signal;

fine tuning control means coupled to said tuning control means and responsive to said IF signal, when enabled to do so, for controlling said tuning control signal so that said IF picture carrier has its nominal frequency; and fine tuning enabling means coupled to said fine tuning control means and responsive to ones of synchronization signals for selectively enabling said fine tuning control means to respond to said IF signal during predetermined portions of respective ones of said retrace intervals.

2. The tuning control apparatus recited in claim 1 wherein:

said fine tuning enabling means selectively enables said fine tuning control means to respond to said IF signal during a predetermined portion of said vertical retrace intervals.

3. The tuning control apparatus recited in claim 2 wherein:

said fine tuning enabling means selectively enables said fine tuning control means to respond to said IF signal during a predetermined portion of said vertical retrace interval which is exclusive of auxiliary intervals reserved for test or teletext information.

4. The tuning control apparatus recited in claims 1, 2 or 3 wherein:

said fine tuning control means includes counting means for counting cycles of said IF signal when enabled to do so by said fine tuning enabling means.

5. The tuning control apparatus recited in claim 4 further including:

synthesis tuning control means coupled to said tuning control signal generating means and responsive to said LO signal for controlling the tuning control signal so that said LO signal has a frequency related to its nominal frequency for the selected channel in a predetermined manner.

6. The tuning control apparatus as recited in claim 2 wherein:
    said fine tuning control means includes IF counter means for counting cycles of said IF signal during a predetermined IF measurement interval when enabled to do so by said fine tuning enabling means; and IF error signal generating means coupled to said counting means for generating either a "low count IF error" signal or "high count IF error" signal depending on the sense of deviation, if any, of the count of said IF counting means at the end of said IF measurement interval from a predetermined IF count corresponding to the nominal frequency of said IF picture carrier; and
    said tuning signal generating means includes up/down counting means coupled to said error signal generating means for counting in an upward or downward sense depending on whether said "low count IF error" signal or "high count IF error" signal is produced by said IF error signal generating means; pulse generating means coupled to said up/down counting means for generating a pulse signal the average value of which depends on the count of said up/down counting means; and means for filtering said pulse signal to generate said tuning control signal.

7. The tuning control apparatus as recited in claim 6 wherein:
    said pulse generating means includes binary rate multiplier means for generating a number of pulse, in a given interval, depending on the count of said up/down counting means.

8. The tuning control apparatus recited in claim 7 further including:
    synthesis tuning control means coupled to said tuning control signal generating means for controlling said tuning control signal so that LO signal has a desired frequency related to its nominal frequency for the selected channel in a predetermined manner, said synthesis tuning control means including LO counting means for counting cycles of said LO signal during a LO predetermined measurement interval; and LO error signal generating means coupled to said LO counting means for generating either a "low count LO error" signal or a "high count LO error" signal depending on the count of said LO counting means at the end of said LO measurement interval in relation to a predetermined LO count corresponding to the desired LO frequency;
    said up/down counting means also being coupled to said LO error signal generating means for also counting in an upward or downward sense depending on whether a "low count LO error" or a "high count LO error" signal is produced by said LO error signal generating means.

9. The tuning control apparatus recited in claim 8 further including:
    mode controlling means causing said up/down counting means to respond to the "LO error" signals in a synthesis mode of operation after a new channel is selected and for causing said up/down counting means to respond to said "IF error" signals in a fine tuning mode of operation after the frequency of said LO signal has been caused to be within a predetermined range of its nominal frequency during the synthesis mode of operation.

10. The tuning control apparatus recited in claim 9 wherein:
    said up/down counting means includes a multi-stage up/down counter; and stage selecting means coupled to said mode controlling means for enabling groups of successively lower order stages of said multi-stage up/down counter to respond to said "LO error" signals during said synthesis mode of operation.

11. The tuning apparatus recited in claim 10 wherein:
    said mode controlling means includes sense detecting means coupled to said LO counting means for detecting when the sense of said "LO error" signals generated by said LO counting means changes during said synthesis mode of operating; and sequence controlling means coupled to said sense detecting means and to said stage selecting means for causing ones of said groups of successively lower order stages of said multi-stage up/down counter to respond to said "LO error" signals when the sense of said "LO error" signals changes during said synthesis mode of operation and being coupled to said up/down counting means for causing said up/down counting means to respond to said "IF error" signals when the sense of said "LO signals" has changed a predetermined number of times.

* * * * *

UNITED STATES PATENT AND TRADEMARK OFFICE
CERTIFICATE OF CORRECTION

PATENT NO. : 4,485,404
DATED : November 27, 1984
INVENTOR(S) : Juri Tults

It is certified that error appears in the above-identified patent and that said Letters Patent is hereby corrected as shown below:

Column 8, line 23, "71" should be --65--.

Column 13, line 11, "produoed" should be --produced--.

Column 13, line 31, "of" should be --if--.

Signed and Sealed this

Twenty-seventh Day of August 1985

[SEAL]

Attest:

DONALD J. QUIGG

Attesting Officer     Acting Commissioner of Patents and Trademarks